United States Patent [19]

Mohiuddin et al.

[11] Patent Number: 4,652,856
[45] Date of Patent: Mar. 24, 1987

[54] MULTIPLICATION-FREE MULTI-ALPHABET ARITHMETIC CODE

[75] Inventors: Kottappuram M. A. Mohiuddin, San Jose; Jorma J. Rissanen, Los Gatos, both of Calif.

[73] Assignee: International Business Machines Corporation, Armonk, N.Y.

[21] Appl. No.: 825,831

[22] Filed: Feb. 4, 1986

[51] Int. Cl.$^4$ ............................................. H03M 7/30
[52] U.S. Cl. ............................................. 340/347 DD
[58] Field of Search ............... 340/347 DD; 235/310; 364/200, 900

[56] References Cited

U.S. PATENT DOCUMENTS

| | | | |
|---|---|---|---|
| 4,122,440 | 10/1978 | Langdon, Jr. et al. | 340/347 |
| 4,259,693 | 3/1981 | Aaron et al. | 358/261 |
| 4,286,256 | 8/1981 | Langdon, Jr. et al. | 340/347 |
| 4,295,125 | 10/1981 | Langdon, Jr. | 340/347 |
| 4,420,771 | 12/1983 | Pirsch | 358/261 |
| 4,467,317 | 8/1984 | Langdon | 340/347 DD |
| 4,494,108 | 1/1985 | Langdon | 340/347 DD |

OTHER PUBLICATIONS

"Method for Converting Counts to Coding Parameters," by G. G. Langdon, Jr. and J. J. Rissanen, IBM Technical Disclosure Bulletin, vol. 22, No. 7, Dec. 1979.
"Integer–Length Arithmetic Code for Conditional Binary Sources," by G. G. Langdon, Jr. and J. J. Rissanen, IBM Technical Disclosure Bulletin, vol. 22, No. 10, Mar. 1980.
"Method for Carry–Over Control in a Fifo Arithmetic Code String," by G. G. Langdon, Jr., IBM Technical Disclosure Bulletin, vol. 23, No. 1, Jun. 1980.
"Apparatus Supporting Half–Duplexed Encoding/Decoding Action," by G. G. Langdon, Jr., IBM Technical Disclosure Bulletin, vol. 23, No. 11, Apr. 1981.

*Primary Examiner*—Charles D. Miller
*Attorney, Agent, or Firm*—Brown, Martin, Haller & Meador

[57] ABSTRACT

Method and apparatus which cyclically generate a compressed, arithmetically-coded binary stream in response to binary occurrence counts of symbols in an uncoded string. The symbols in the uncoded string are drawn from a multi-character alphabet which is not necessarily a binary one. Coding operations and hardware are simplified by deriving from the binary occurrence counts an estimate of the probability of each unencoded symbol at its precise lexical location. The probability estimation eliminates any requirement for division or multiplication by employing magnitude-shifting of the binary occurrence counts. The encoded stream is augmented by the estimated symbol probability at the same time that an internal variable is updated with an estimate of the portion of a probability interval remaining after coding the current symbol, the interval estimate being obtained from the left-shifted occurrence counts. Decoding is the dual of encoding. The unencoded symbol stream is extracted, symbol-by-symbol, by subtracting the estimated symbol probability that comes closest to, but does not exceed the magnitude of the compressed stream, re-estimating the symbol probabilities based upon the decoding, and testing the difference of the subtraction against the re-estimated probability.

12 Claims, 7 Drawing Figures

MULTIPLICATION-FREE MULTI-ALPHABET ARITHMETIC CODE

BACKGROUND OF THE INVENTION

This invention relates to arithmetic compression coding of multi-alphabet sources, and more particularly to arithmetic coding wherein each symbol of a multi-alphabet symbol stream is encoded according to a probability interval variable whose value is cyclically readjusted with the coding of each symbol to reflect an estimate of the probability of the portion of the symbol stream already encoded.

Arithmetic codes of the FIFO-Form (first-in-first-out) are established in prior art and may be understood by reference to Langdon and Rissanen, "A Simple General Binary Source Code," IEEE Transactions On Information Theory, Volume IT-28, No. 5, September 1982. In the Langdon and Rissanen 1982 reference, and in other references cited therein, arithmetic coding is revealed as a cyclic process that generates a bindary code string by augmenting a present code string resulting from the encoding of previous source string symbols. The power of arithmetic codes is in the compression they achieve, and their flexibility is in their ability to encode strings modeled by stationary or non-stationary sources with equal ease. Arithmetic codes permit encoding of binary strings without the need for alphabet extension, and also encode strings with symbols drawn from alphabets containing more than two characters.

An arithmetic code basically updates the probability P(s) of a so-far processed source string s, by the multiplication P(s)P(i/s) where P(i/s) is a conditional probability of the symbol i given s. The multiplication required for augmenting the probability is relatively expensive and slow, even in the case where the probabilities are represented by binary numbers having at most a fixed number of significant digits.

A signal advance in simplifying the arithmetic encoding operation in the particular case of a binary alphabet is described in U.S. Pat. No. 4,467,317. According to that patent, the encoded binary string is a number in the semi-open interval [0, 1) and the encoding method provides for recursively augmenting the code string in response to each symbol in the unencoded string. The coding process is described as the successive subdivision of the semi-open interval into a subinterval positioned between a lower bound C(s) contained in the interval, and an upper limit C(s)+T(s), also contained in the interval, where T(s) is an internal coding variable expressed as a function of numeral $2^{-k}$.

The prior art U.S. Pat. No. 4,467,317 teaches that the generation of a binary arithmetically-encoded stream is generated by the recursions of (1a)-(1d).

For each MPS:

$$C(sMPS) = C(s) + 2^{-k} \quad (1a)$$

$$T(sMPS) = T(s) - 2^{-k} \quad (1b)$$

For each LPS:

$$C(sLPS) = C(s) \quad (1c)$$

$$T(sLPS) = 2^{-k} \quad (1d)$$

According to these equations, the magnitude of the binary arithmetically-coded stream C(s) is altered only on the occurrence of the more probable symbol (MPS), instead of on the occurrence of the less probable signal (LPS). Accordingly, an arithmetically-encoded binary stream C(s) is recursively generated in high-to-low position magnitude order in response to successive symbols b(i) of a binary symbol string s=b(1), b(2) ... b(i), ... b(n). The steps of generation are compounded of entering the q-least-significant bits of the encoded stream C(s) and an internal coding variable T(s) into respective registers, and determining whether the next symbol in the stream s constitutes an MPS, while receiving a binary integer parameter k which approximates the probability $2^{-k}$ of an LPS; upon the occurrence of an MPS, simultaneously adding $2^{-k}$ to the C register and substracting it from the T register; and left-shift normalizing both the C and T register contents if the T register contains a leading zero, or if the next symbol of s is an LPS, left-shifting the C register contents by k positions and entering the binary value 1.00 ... 00 into the T register. This recursive technique maintains the working end of the code string C(s) in the C register and in alignment with the significant bits of the subinterval size T so that the code string is augmented in the proper place. Further, the tracking of the C(s) working end and the updating of T(s) are done concurrently, which has the very desirable effect of increasing the speed of the coding operation.

While the recursive technique of U.S. Pat. No. 4,467,317 greatly simplified the encoding operation of a binary symbol stream by approximating the probability of the LPS with an integral power of ½, the same idea is not generalized easily to non-binary alphabets for the reason that the n-ary alphabet symbol probabilities cannot be approximated well enough as powers of ½. This limitation is significant in view of the fact of growing parallelism in the data structures and operations of present-day processors. A method and means for compressive arithmetic encoding of symbol streams embracing more than two distinct alphabet characters would be useful to encode, for example, a symbol stream consisting of a succession of data bytes. In this case, the alphabet would consist of 256 distinct characters (byte formats) and the stream would be encoded byte-by-byte. At present, compressive arithmetic encoding encodes and decodes on a bit-by-bit basis and requires serialization of parallel data structures, which introduces complexity and delay into the coding process.

Further, the algorithmic approach to prior art arithmetic encoding depends upon the existence of a sophisticated modeling unit capable of calculating and providing the source statistical characteristics k. As taught in Langdon and Rissanen, 1982, implicit in the calculation of k is the default of a skew number calculation operation to the modeling unit, an operation which adds to the complexity of the overall data compression problem that comprehends modeling and encoding the data source.

At this point, then, arithmetic compression encoding awaits an advance of the art to accommodate the arithmetic encoding of multi-character-alphabet data sources by a method and means operating without multiplication or division to generate a binary code stream in response to simplified data source statistical characteristics that preserve the very desirable prior art property of concurrent updating of both the code stream and an internal coding variable.

INVENTION SUMMARY

The technological advance afforded by this invention is expressed as the compressive arithmetic encoding of multi-character alphabet data sources in response to elementary data source statistical characteristics by means that preserve the increased concurrency of operation embodied in the prior art arithmetic encoders. The invention is based upon an encoding action that accepts symbol occurrence counts in binary form, subjects those counts to simple magnitude shift operations to approximate the contextual probability of each symbol of the symbol stream, augments the coded stream, and then simultaneously locates the w least significant bits (the working end) of the code stream and adjusts the value of an internal coding variable determinative of the next coding subinterval in response to one of the shifted occurrence counts.

The invention resides in a method for recursive machine modification of a code string C(s) of binary numbers to produce C(si) where C(si) is a compressed representation of and responsive to the next symbol i in a symbol string s. In this regard, the symbol string s is a concatenation of symbols drawn from an alphabet having two or more characters, o, ..., m. Further, the method is premised on C(si) being a number in the semi-open coding range [0, 1) that is subdivided into intervals during successive machine string modification cycles. Each interval resulting from a coding recursion is defined by its lower bound C(s) and a coding parameter A(s) such that the interval is [C(s), C(s)+A(s)). The method is executable upon a pair of registers C and A, each having a finite size w.

In performing the method, the following steps are executed: respective initial contents are placed in registers A and C; for the next symbol i in the string s, binary symbol occurrence counts are read in for the portion of s preceding i. In this regard, the occurrence counts include $n_i$, the count of occurrences of i, $Q(i) = n_0 + n_1 + \ldots + n_{i-1}$, the sum of counts for the symbols 0, 1, ..., i−1 preceding i in the alphabet, $Q(m) = n_0 + n_1 + \ldots + n_{m-1}$, the sum of counts for the symbols preceding m in the alphabet, and N, the count of all symbols in the portion. The occurrence statistics $n_i$, Q(i), and Q(m) are normalized by left-shifting an amount based upon the placement of N in a predetermined range. Then, if the next symbol i is not m, the normalized value of Q(i) is added to the contents of C, the contents of A are replaced with the normalized value of $n_i$, and the contents of C and A are shifted in a predetermined magnitude direction until the contents of A lie within a predetermined range. Alternatively, if the next symbol i is m, the normalized value of Q(m) is added to the contents of C and subtracted from the contents of A, and the contents of C and A are left-shifted until the contents of A lie within the predetermined range. After the ultimate symbol of s is encoded, the contents of C are left-shifted by w positions. The coded string C(s) constitutes the successive symbols emerging from the register C as a consequence of the succession of left-shift operations performed on its contents in execution of the method.

DETAILED DESCRIPTION OF THE EMBODIMENT

Figure 1:
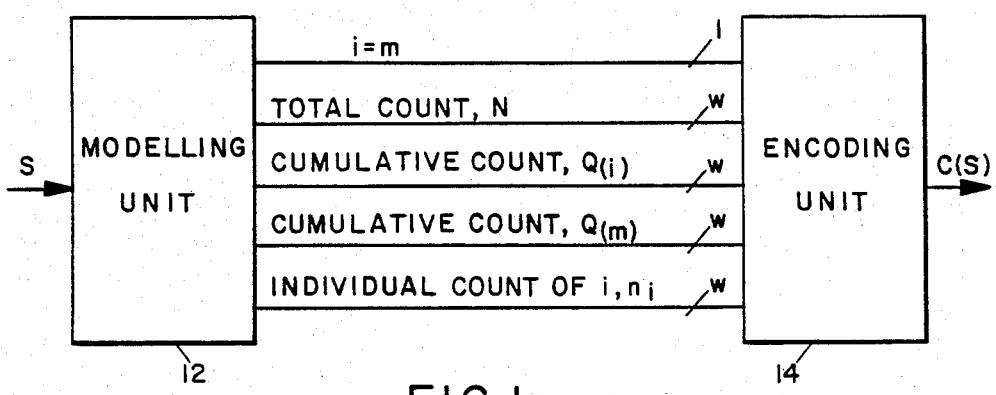
FIG. 1 is a block diagram illustrating the provision of elementary data source statistics and other control signals by a modeling unit to an encoding unit in response to a data source.

To place the invention in a known environmental context, reference is given to Rissanen and Langdon, "Universal Modeling and Coding," IEEE, Transactions on Information Theory, Volume IT-27, No. 1, January 1981, in which data compression is characterized as a manifold task including modeling and coding aspects. The data compression duality is illustrated in FIG. 1 where a modeling unit 12 receives a symbol stream s from a data source, not shown. The symbol stream s is a concatenation of symbols drawn from an alphabet consisting of the symbol i=0, 1, ..., m.

Compression of the symbol string is accomplished by an arithmetic coding method that encodes s, symbol for symbol, in a high-to-low order magnitude direction. When arithmetically encoding the next symbol i, immediately following the so-far processed string s, the method utilizes modelling parameters that represent the conditional probability of the occurrence of i at its context, which is the entire portion of the string s that precedes i. These model parameters are provided by the modeling unit; in their most elemental form the parameters are provided in terms of integer-valued symbol occurrence counts. The occurrence counts provided by the modeling unit 12 are in binary form and include: $n_i$, the number of occurrences of i in the portion of the string preceding its instant occurrence; N, the sum of all of the counts ni, i=0, 1, ..., m; $Q(i) = n_0 + \ldots + n_{i-1}$, where Q(0)=0; and $Q(m) = n_0 + \ldots + n_{m-1}$.

To enhance the speed of the coding process, the modeling unit 12 updates for each symbol i in the symbol stream s, not only the counts N and $n_i$, but also all of the cumulative counts Q(j), j>i, which are affected by $n_1$.

For certain reasons related to precision and approximation that are described below, it is assumed that the last symbol m of the alphabet is the symbol with the highest count; that is, $n_m \geq n_i$, for all i. Signification of the occurrence of m in the data stream s is provided by the modeling unit 12 on a signal line i=m.

The occurrence counts and the signification i=m are provided by the modeling unit 12 to an encoding unit 14. The encoding unit 14 responds to the inputs provided by the modeling unit to produce the binary, arithmetically-encoded string C(s).

The encoding unit 14 employs a method and means to construct the code string C(s) as a cumulative probability of the portions of the data string s that precede the current one in the lexical order of the strings. When calculating this cumulative probability, the encoder 14 uses an approximation A(s) of the cumulative probability P(s). The encoding action according to the invention calculates C(s) as a binary fractional number representing the code; that is, the cumulative probability of the string s. The following recursions define the encoding action of the invention where the code C(s), the cumulative probability of the string s, is augmented to produce the code C(si) of the one symbol longer string si:

$$C(s0) = C(s) \quad (2a)$$

$$C(si) = C(s) + A(s0) + \ldots + A(s(i-1)), \, i > 0 \quad (2b)$$

where, the notation s(i−1) is used for the string consisting of s followed by the symbol i−1 that precedes i in the alphabet. The initial conditions of equations (2a) and (2b) are $C(\lambda) = 0$ and $A(\lambda) = 1$, where $\lambda$ denotes the empty string.

It is recognized that the coding variable A(s), which corresponds to the length of the available coding interval remaining after the calculation of C(s) according to equations 2a and 2b must be recalculated to account for the previous subdivision of the coding space represented by the augend $(A(s0) + \ldots + A(s(i-1)))$. The encoding action of the invention performs that recalculation based upon equation (3).

$$A(s) = A(s0) \ldots + A(m) \quad (3)$$

As taught in the Rissanen and Langdon 1981 reference, equation (3) ensures that C(s) will be decodable when calculated according to equations (2a) and (2b). Further, as required by the theory expressed in the reference, the initial value of 1.0 ... 0 causes A(s) to define a bona fide information source.

As described in the discussion following, the actual arithmetic operations called for by the recursions of equations (2a)–(3) are done in a pair of fixed-size registers of width w, one register for C(s), and the other for A(s). These register-based arithmetic operations are possible if the normalized quantity $\bar{a}(s)$ is introduced, and if $a(s) = 2^{L(s)} A(s)$, where L(s) is a non-negative integer determined by the requirement that $\bar{a}(s)$ is a w-digit binary number in a fixed range. For the purposes of normalizing A(s) according to the invention, the following range turns out to be suitable:

$$0.11_{(binary)} \leq \bar{a}(s) < 1.1_{(binary)} \quad (4)$$

Given the normalization of A(s), the recursion of equation (3) reads as follows:

$$\bar{a}(s) = \bar{a}(s0) + \ldots + \bar{a}(sm) \quad (5)$$

where $\bar{a}(si) = 2^{L(s)} A(si)$. One will appreciate that as the magnitude of C(s) increases, as it will by equations (2a) and (2b), the coding space available will shrink, with the shrinkage represented in the decrease of A(s), as implied by equation (3). As A(s) decreases, L(s) increases, $\bar{a}(s)$ is placed in the range (4) by left-shifting, relative to the register A, and the quantities added to C(s) according to equation (2b) move to the right, or, equivalently, the code string C(s) is shifted left relative to the fixed register C where the augmentation of the w significant bits of the string takes place.

In the general case of the alphabet containing more than two characters, the probability approximations required for recursions (2a) through (3) are obtained from the occurrence counts provided by the modeling unit 12. The approximations are obtained first by scaling the binary representation of the total count N to make it as nearly equal to the binary representation of A(s) as possible. For this purpose the scaling quantity k(n) is introduced as the value of the integer k which minimizes the absolute distance $|2^{-k}N - \bar{a}(s)|$ and places N in the range (4). Then, the following normalized counts are defined:

$$\bar{N} = 2^{-k(n)} N \quad (6a)$$

$$\bar{n}_i = 2^{-k(n)} n_i \quad (6b)$$

$$\bar{Q}_i = 2^{-k(n)} Q_{(i)} \quad (6c)$$

According to the invention, the approximations of the right-hand terms in recursion (2b) are defined as $\bar{a}(si) = \bar{n}_i$, for all $i < m$. The usefulness of this approximation will be evident when it is considered that $\bar{N} = \bar{n}_0 + \ldots + \bar{n}_m$ and that the probability P(i/s) of i at its lexical position in s is given by $$P(i/s) = \bar{n}_i / \bar{N} \quad (7)$$

which, in the invention, is approximated by $\bar{a}(si)/\bar{a}(s)$. Because $\bar{a}(s)$ and $\bar{N}$ are in the common range (4), $$\bar{a}(si) \approx \bar{n}_i \quad (8)$$

and $$\bar{a}(sm) = \bar{a}(s) - \bar{Q}(m) \quad (9)$$

This permits $\bar{a}(si)$ and $\bar{a}(sm)$ to be obtained from the occurrence counts by simple normalization, analogously with the normalization used to bring A(s) to the range (4). It will be appreciated that if $\bar{N} \approx \bar{a}(s)$, in effect, the ideal probability (7) is well approximated as $$\frac{\bar{n}_i \cdot \bar{N}}{\bar{a}(s)} \approx \bar{n}_i.$$

It will be recalled that the last alphabet symbol m is assumed to have the highest count. Hence, it may be that $\bar{N} > \bar{a}(s)$, in which case the addend for m, that is, $\bar{a}(sm) = \bar{a}(s) - \bar{Q}(m)$, may be negative. To avoid this possibility, the magnitude of $\bar{Q}(m)$ is tested against $\bar{a}(s)$ after the occurrence counts are scaled according to (6a)–(6c). When the test indicates the negative case, k(n) is replaced by k(n)+1, guaranteeing positivity of all of the addends.

Figure 2:
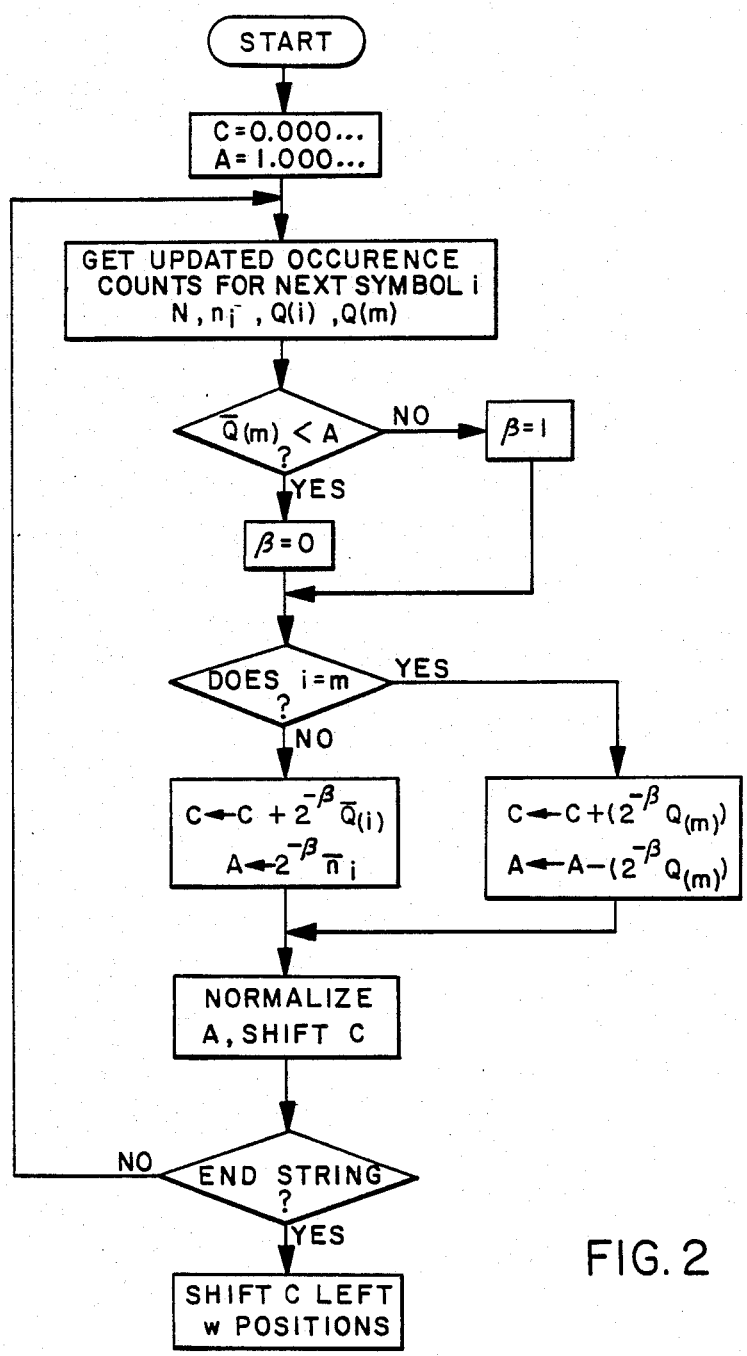
FIG. 2 is a flow diagram of the encoding algorithm of the invention.

Referring again to FIG. 1, the encoding unit 14 responds to the occurrence counts and signification i = m provided by the modeling unit 12 by producing C(s) according to the procedure illustrated in FIG. 2. The procedure of FIG. 2 progresses using the two registers C and A. Each register is capable of storing a w-bit binary number. The content of register C is interpreted as the w least significant bits of the binary fractional number representing C(s), with the binary point to the left of the left-most (most significant) storage cell of the register. Register A also accommodates a w-bit binary number decreasing in significance from left to right with the binary point placed between the first and second storage positions on the left-hand side (most significant end) of the register.

The computational steps of the FIG. 2 flow diagram accomplish the recursions (2b) and (3) using normalized occurrence counts for the estimated values of equations (4) and (5). Initially, registers C and A are set respectively to w-bit values 0.00 ... 0 and 1.00 ... 0. During each encoding cycle, the encoder 14 is provided with the binary occurrence counts-N, $n_i$, Q(i), and Q(m)—as well as a binary signification signal that indicates whether or not the current symbol i is m. A cycle of the FIG. 2 method begins by testing the cumulative count $\overline{Q}(m)$ against the current contents of the A register to determine whether the addend $\overline{a}(sm)$ will be negative. If $\overline{Q}(m) < A$, a value ($\beta$) is set equal to 0; otherwise, ($\beta$) is put at 1. In this regard, ($\beta$) is the value by which k(n) is augmented as discussed above; essentially, ($\beta$) determines whether the normalized occurrence counts are further scaled by the quantity ½. As will be apparent to those skilled in the art, if ($\beta$) = 1, the normalized occurrence counts are scaled simply by right-shifting their binary representations by 1 bit against a binary point fixed in a shift register.

Once the magnitude test of $\overline{Q}(m)$ against A is completed, the signification signal is consulted to determine whether the current symbol i is the last symbol m of the alphabet. If the current symbol i is not the last, the normalized quantity $\overline{Q}(i)$, scaled by $2^{-(\beta)}$ is added to the contents of the C register and the normalized value of the individual occurrence count, $\overline{n}_i$, scaled by $2^{-(\beta)}$, is loaded into the A register. Thus, in this step the working end of C(s) is augmented by using $\overline{a}(i)$ as the approximation of the contextual probability P(s)P(i/s), while the approximation of the coding variable A(s) is changed to $\overline{n}_{ni}$ to reflect the change in the coding interval implied by equation (3).

If, on the other hand, i = m, the scaled normalized occurrence count $\overline{Q}(m)$ is added to the contents of the C register and subtracted from the contents of the A register.

Following the augmentation of the code string C(s) and the updating of the coding variable A(s), the contents of the C and A registers are left-shifted as many positions as are needed to bring the contents of the A register into the range (4), and the vacated C and A register positions are filled with zeros. This joint shifting operation maintains the alignment of the significant bits of the normalized coding interval to the working end, that is the w least significant bits, of the code string C(s); it also ensures that the addend resulting from the next cycle of the coding operation will be added at the proper position in the code string. This shifting operation corresponds to the placement of a(s) in the range defined by equation (4).

When the end of the string s is reached, the contents of the C register are shifted left w positions and the code string C(s) is complete. As is known, data strings are typically framed between symbols that uniquely identify the beginning and end of a string. Left-shifting of the C register contents by the required number of positions when the end of a data source string is reached can be done automatically if the end-of-string symbol is arbitrarily assigned the value $2^{-w}$. In this case, the shifting step of the coding procedure will result in the contents of the C and A registers being left-shifted by w bit positions.

As will be evident to those skilled in the art, whenever the C register contents are left-shifted, the bits "emitted" from the left end of the register will constitute the successive symbols in the code string C(s). The shifted bits may either be transmitted or stored in an appropriate storing device which can form a leftward extension of the C register. Manifestly then, the code string C(s) consists of all the symbols transmitted or stored as a result of the left-shifting of the C register as well as the symbols residing inside the register.

It may be that as numbers are added to the C register, a carry-over from the w least significant bits of C(s) will occur. Special bit stuffing routines are known in the art (Langdon and Rissanen, 1982) which may be used to handle such carries. Also, in order to reduce the frequency of the carry occurrences, the C register may be augmented at its left end by another register of width w to accommodate carries into the more significant bits of C(s) that are shorter than w.

The following examples illustrate the encoding operations of the invention.

Let the alphabet consist of the characters:

1, 2, 3.

define the source string as follows:

s = 1,2,2,3,1,1 assume the modeling unit 14 accumulates the occurrence counts N, $n_i$, and Q(i), where Q(1) is defined as 0, and assume also that the coding unit 14 performs the normalization of the occurrence counts based upon the placement of N in the range (4). The modeling unit 12 will then accumulate occurrence counts and the coding unit will normalize them based upon the scaling of N to the range (4). Consider further that the modeling unit 12 initially assumes the alphabet symbols to have equal probabilities of occurrence and implements this assumption by assigning each symbol an initial count of $1_{(binary)}$. Table I shows the accumulation of the occurrence counts by the adapter, as well as the normalized occurrence counts that are generated by the encoding unit 14, that is, $\overline{n}_i$, $\overline{Q}(i)$, and $\overline{Q}(3)$.

TABLE I

| Counts | Binary Values; Q(1) = $\overline{Q}(1)$ = 0 | | | | | | |
|---|---|---|---|---|---|---|---|
| | S = 1 | 2 | 2 | 3 | 1 | 1 | # |
| N | 11 | 100 | 101 | 110 | 111 | 1000 | — |
| $n_1$ | 01 | 10 | 10 | 10 | 10 | 11 | — |
| $n_2$ | 01 | 01 | 10 | 11 | 11 | 11 | — |
| $n_3$ | 01 | 01 | 01 | 01 | 10 | 10 | — |
| Q(2) | 01 | 10 | 10 | 10 | 10 | 11 | — |
| Q(3) | 10 | 11 | 100 | 101 | 101 | 110 | — |
| $\overline{N}$ | 0.11 | 1.00 | 1.01 | 0.110 | 0.111 | 1.00 | — |
| $\overline{n}_i$ | 0.01 | 0.01 | 0.10 | 0.001 | 0.010 | 0.011 | 0.001 |
| $\overline{Q}(i)$ | 0.00 | 0.10 | 0.10 | 0.101 | 0.00 | 0.0 | 0.000 |
| $\overline{Q}(3)$ | 0.10 | 0.11 | 1.00 | 0.101 | 0.101 | 0.11 | 0.11 |

From the values provided to the encoder 14 by the modeling unit 12, the contents of C are augmented by $\overline{Q}(i)$. If is is not equal to m, the coding variable represented by the contents of the A register are given by $\overline{n}_i$; otherwise, the variable is altered by subtracting $\overline{Q}(3)$ from its present contents. Once the contents of C are augmented and the contents of A are changed, C and A are left-shifted in lock-step until the contents of A lie within the specified range.

Table II lists the contents of both the C and A registers after each symbol has been encoded according to the FIG. 2 procedure.

TABLE II

| Next Symbol,i | ($\overline{n}_i,\overline{Q}(i),\overline{Q}(3)$) | Shift Result | C Reg | | A Reg |
|---|---|---|---|---|---|
| Initialize | | | 000 0000 | | 1.000 |
| 1 | (0.010,0.000,0.100) | | 000 0000 | | 0.010 |
| | | 00 | 000 0000 | (shift) | 1.000 |
| 2 | (0.010,0.100,0.110) | | 000 1000 | | 0.010 |
| | | 00 | 010 0000 | (shift) | 1.000 |
| 2 | (0.100,0.100,1.00) | | | | (scale by ½) |

TABLE II-continued

| Next Symbol,i | $(\bar{n}_i, \bar{Q}(i), \bar{Q}(3))$ | Shift Result | C Reg | | A Reg |
|---|---|---|---|---|---|
| | (0.010,0.010,0.100) | | 010 0100 | | 0.010 |
| | | 01 | 001 0000 | (shift) | 1.000 |
| 3 | (0.001,0.101,0.101) | | 001 1010 | | 0.011 |
| | | 0 | 011 0100 | (shift) | 0.110 |
| 1 | (0.010,0.000,0.101) | | 011 0100 | | 0.010 |
| | | 01 | 101 0000 | (shift) | 1.00 |
| 1 | (0.011,0.000,0.110) | | 101 0000 | | 0.011 |
| | | 1 | 010 0000 | (shift) | 0.110 |
| # | | 0100 | | | (shift by 4) | c(s) = 00 00 010 011 0100 *

In Table II, the C register contents are illustrated as the four least significant bits of C(s) to the right of three guard bits. As stated above, the contents of the C register are initialized to 000.0000, while the A register is initially set to 1.000. Now, for example, the first symbol of the symbol string s, that is, 1, is encoded by adding $\bar{Q}(1)$ to the contents of the C register, while $\bar{n}_1$ is entered into the A register. Thus, before the shifting operation following encoding of the first symbol, the C and A register contents are as shown in Table II for the first occurrence of the symbol 1. The shift operation following the augmentation of C contents and alteration of the A register contents requires a left-shift of the C and A register contents by two places, making the contents of the A register 1.000, which is within range (4).

Of particular interest in the example Table II is the scaling required prior to encoding the second occurrence of 2. It will be noted that the value of $\bar{Q}(3)$ provided to the encoder is 1.000, which is equal to the contents of the A register. Consequently, before the encoding of the symbol, the normalized occurrence counts are scaled by ½ as prescribed by the FIG. 2 procedure.

The coding example embodied in Table II generates the compressed string C(s)=00000100110100*, where * serves as an end-of-string marker.

Figure 3:
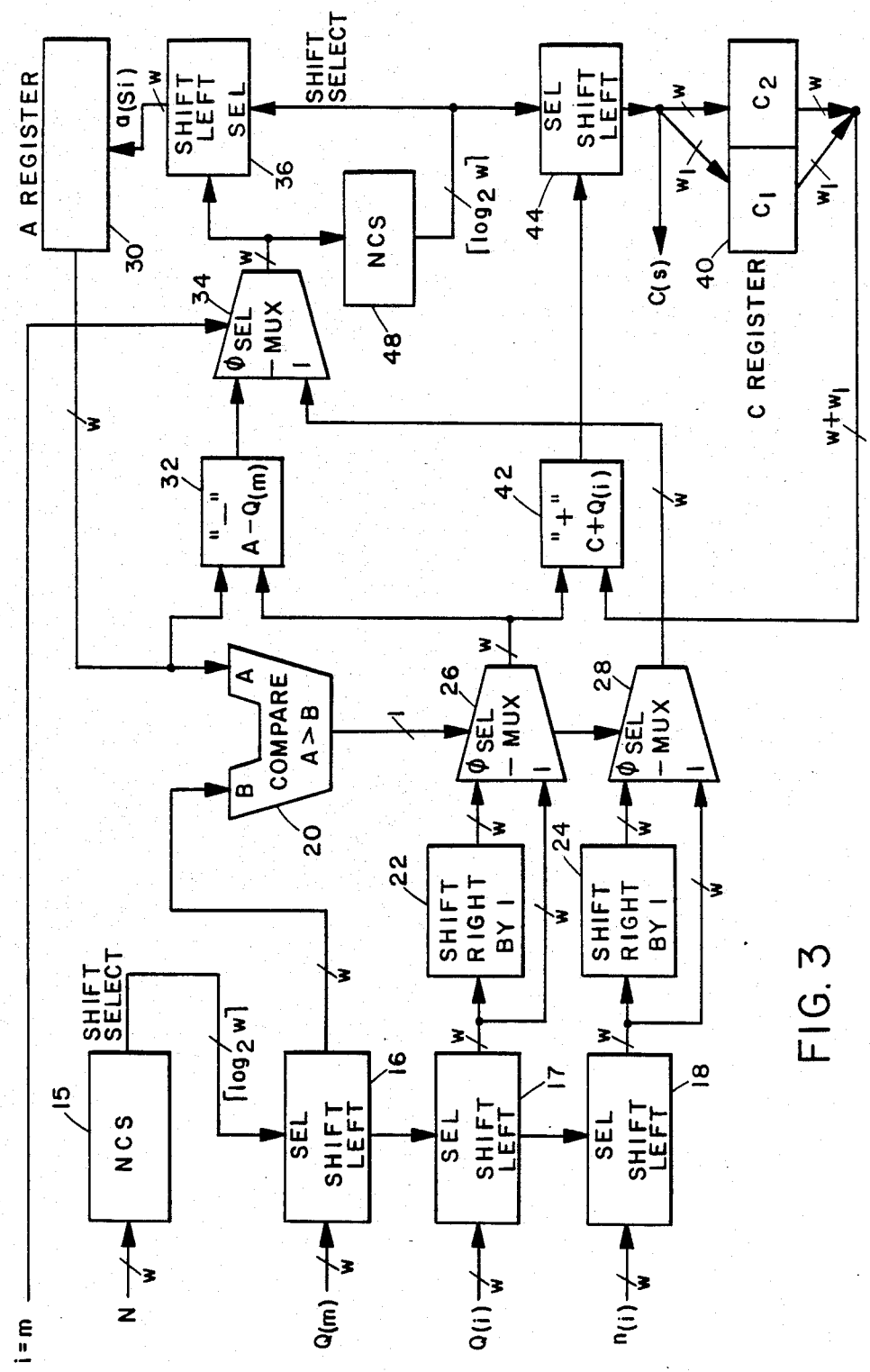
FIG. 3 is a block diagram of arithmetic and logic operations implicit in the FIG. 2 encoding algorithm.

Referring now to FIG. 3, it will be appreciated that the encoder block diagram accomplishes the steps of the FIG. 2 procedure, that is, the comparison of Q(m) and the contents of the A register, the concurrent yet independent generation of an augend for the code stream C(s) and adjustment of the value of the coding variable A(s), and the alignment of the w least significant bits of the code stream C(s) as determined by the normalization of the contents of the A register.

In its most general expression, the encoder 14 will respond to the unnormalized occurrence counts N, $n_i$, Q(i), and Q(m), and itself perform the normalization of these values. Therefore, FIG. 3 includes a normalization network including a normalized control select circuit (NCS) 15 and shift networks 16, 17, and 18. The symbol count total N is provided to the NCS 15, while the occurrence counts Q(m), Q(i), and $n_i$, are terminated in the shift networks 16, 17, and 18, respectively. The NCS 15 operates conventionally, responding to the non-normalized value for N to determine the number of bits of shift that N has to undergo such that the shifted number $\bar{N}$ will be in the range (4). The output of the normalize control select circuit 15 is a binary SHIFT SELECT signal whose magnitude corresponds to the number of bits of shift required to normalize the parameters Q(m), Q(i), and $n_i$. Generally, if N has w bits, the SHIFT SELECT output should have [$\log_2 w$] bits.

Figure 7:
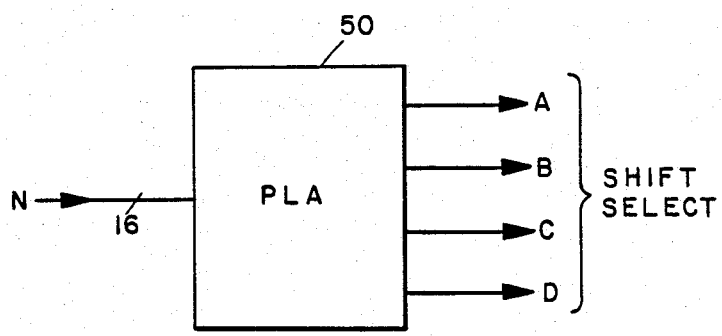

Refer to FIG. 7 for more detailed understanding of the NCS 15. FIG. 7 assumes that N has no more than 16 bits, $b_0, b_1, \ldots, b_{15}$, with $b_0$ the MSB and $b_{15}$ the LSB. Thus, the representation of the amount of shift provided by the PLM 50 as an output would require a 4-bit wide SHIFT SELECT signal. In FIG. 7 the SHIFT SELECT signal comprises the output bits A, B, C, and D, with A being the most significant, and D the least significant bits. The FIG. 7 NCS is implemented in a programmable logic array (PLA), indicated by reference numeral 50. The PLA 50 is conventionally programmed using Boolean equations to determine the number of bits of shift required to bring N into the range (4). The direct combinatorial realization of the PLA 50 is exemplified by the following Boolean partial equations:

$$D = (\bar{b}_0 \cdot \bar{b}_1) + (\bar{b}_0 \cdot b_1 \cdot b_2) + \ldots, \text{etc.}$$

$$C = (\bar{b}_0 \cdot b_1 \cdot \bar{b}_2) + (\bar{b}_0 \cdot \bar{b}_1 \cdot b_2 \cdot b_3) + \ldots, \text{etc.}$$

$$B = (\bar{b}_0 \cdot \bar{b}_1 \cdot \bar{b}_2 \cdot \bar{b}_3 \cdot b_4 \cdot b_5) +$$

$$(\bar{b}_0 \cdot \bar{b}_1 \cdot \bar{b}_2 \cdot \bar{b}_3 \cdot b_4 \cdot \bar{b}_5 \cdot b_6) + \ldots, \text{etc.}$$

$$A + (\bar{b}_0 \cdot \bar{b}_1 \cdot \bar{b}_2 \cdot \bar{b}_3 \cdot \bar{b}_4 \cdot \bar{b}_5 \cdot \bar{b}_6 \cdot \bar{b}_7 \cdot b_8 \cdot b_9) +$$

$$(\bar{b}_0 \cdot \bar{b}_1 \cdot \bar{b}_2 \cdot \bar{b}_3 \cdot \bar{b}_4 \cdot \bar{b}_5 \cdot \bar{b}_6 \cdot \bar{b}_7 \cdot b_8 \cdot \bar{b}_9 \cdot b_{10}) + \ldots, \text{etc.}$$

A mapping of these functions is provided in Table III, where "x" corresponds to a "don't care" state and the output is the binary representation of the number of bits of shift required to bring N to the range (4).

TABLE III

| MAPPING OF NSC TRANSFER FUNCTIONS | | | | | | | | | | | |
|---|---|---|---|---|---|---|---|---|---|---|---|
| INPUT N | | | | | | | | OUTPUT | | | |
| $b_0$ | $b_1$ | $b_2$ | $b_3$ | $b_4$ | ... | $b_{14}$ | $b_{15}$ | A | B | C | D |
| 1 | 1 | X | X | X | ... | X | X | 0 | 0 | 0 | 0 |
| 1 | 0 | X | X | X | ... | X | X | 0 | 0 | 0 | 1 |
| 0 | 1 | 1 | X | X | ... | X | X | 0 | 0 | 0 | 1 |
| 0 | 1 | 0 | X | X | ... | X | X | 0 | 0 | 1 | 0 |
| 0 | 0 | 1 | 1 | X | ... | X | X | 0 | 0 | 1 | 0 |
| 0 | 0 | 1 | 0 | X | ... | X | X | 0 | 0 | 1 | 1 |
| 0 | 0 | 0 | 0 | 0 | ... | 1 | 1 | 1 | 1 | 1 | 0 |
| 0 | 0 | 0 | 0 | 0 | ... | 1 | 0 | 1 | 1 | 1 | 1 |
| 0 | 0 | 0 | 0 | 0 | ... | 0 | 1 | 1 | 1 | 1 | 1 |

For understanding Table III, assume the radix point is immediately to the left of $b_0$ in the unnormalized N input to the NSC. The output specifies the number of places of left-shift that must be applied to N to bring it to the range (4), that is, the interval [0.1100 ... 0, 1.100 ... 0). The output therefore corresponds to the SHIFT SELECT signal.

The SHIFT SELECT signal is provided to the left-shift networks 16–18, and each responds by left-shifting its respective terminated occurrence count by the number of bits required to bring N to the range (4). This completes the process of normalization of the occurrence counts by the encoder.

In accomplishing the coding operations of the FIG. 2 method, the encoder 14 utilizes a comparison and control loop including a comparator 20, a pair of shift networks 20 and 24, and a pair of multiplexers 26 and 28. Operations on the contents of the A register 30 are performed by a computation loop including a subtractor 32, a multiplexer 34, and a left-shift network 36. The contents of the C register 40 are processed in a loop including an adder 42 and a shift network 44. The C register is illustrated as a pair of registers $C_1$ and $C_2$. In this regard, $C_1$ is the guard register described above, while $C_2$ has the w least significant bits of C(s). The binary point is between $C_1$ and $C_2$; C(s) is augmented by adding into $C_2$.

Both the C and A registers comprise conventional flip-flop or latch circuitry that is clocked at the end of each cycle of the encoding operation of FIG. 2.

The normalized values $\overline{Q}(i)$ and $\overline{n}_i$ are scaled by a right shift of one bit each in right-shift circuits 22 and 24. Both the right-shifted (scaled) and the unscaled normalized occurrence counts are terminated at 0 and 1 ports, respectively, of multiplexers 26 and 28. The multiplexers 26 and 28 operate to select the scaled or unscaled normalized values according to a select signal provided by the comparison circuit 20. Comparison circuit 20 is a conventional binary magnitude comparator that receives the current value of $\overline{Q}(m)$ and the contents of the A register 30. If the magnitude of the normalized occurrence count $\overline{Q}(m)$ equals or exceeds the magnitude of the A register contents, the output of the comparator 20 will switch the respective outputs of the multiplexers 26 and 28 to their 0 ports, thereby selecting the scaled normalized values $2^{-1}\overline{Q}(i)$ and $2^{-1}\overline{n}_i$, respectively. On the other hand, if the magnitude of the A register contents exceeds the magnitude of $\overline{Q}(m)$, the outputs of the multiplexers 26 and 28 will be switched to the unscaled normalized occurrence counts $\overline{Q}(i)$ and $\overline{n}_i$, respectively.

The concurrent augmentation of the C register contents and change of the internal coding variable a(s) are next described. The current contents of the C register are available as one input to a conventional binary adder 42, which also accepts the value selected by the multiplexer 26. The adder 42 binarily adds the content of the C register with the scaled or unscaled value of $\overline{Q}(i)$ as determined by the multiplexer 26. The sum of the addition operation performed by the adder 42 is provided to a conventional digital shift circuit 44 for the left-shifting operation necessary to align the working end of the code stream C(s). In the event that the current symbol i is not m, the multiplexer 34 responds to the signification signal by connecting to its output the value selected by the multiplexer 28. Otherwise, if the current symbol i is m, the output of the multiplexer 34 is connected to the output of the conventional binary subtracter circuit 32. The binary subtracter circuit 32 receives the contents of the A register and subtracts from the contents the normalized Q(m) value selected by the multiplexer 26. The output of the multiplexer 34 is provided both to the binary shift circuit 36 and to the normalize control select (NCS) circuit 48.

The NCS 48 operates conventionally to respond to the non-normalized value for a(s) selected by the multiplexer 34 in order to determine the number of bits of shift that the unnormalized value must undergo to be placed into the range (4). The output of the NCS 48 specifies the amount of shift for normalizing a(s) and aligning the working end of the code string C(s) with the normalized value of the coding variable. If the input to the NCS circuit 48 has w bits of significance, the output of the circuit will have [$\log_2$ w] bits.

The number of bits of left-shift required to normalize the current value of a(s) and to align the working end of C(s) with the normalized value is fed to the left-shift circuits 36 and 44, which perform the left-shifting required for $\overline{a}$(s) and C(s), respectively. The left-shifted values are provided, respectively, to the A register 30 and the C register 40. The code string C(s) is obtained from the output of the shift circuit 44.

As is known in the art, decoding is the dual of encoding. As with prior art arithmetic-encoding techniques, decoding of the compressed stream produced by the invention proceeds by examining the most significant part of the code string C(s) and determining from its magnitude the largest possible addend that does not exceed the current value of the code string. However, as with the encoding procedure of the invention, the augends tested against the most significant part of the compressed string are obtained from occurrence counts.

Generally, it can be said that the occurrence counts for a decoder will be obtained from a modeling unit corresponding to the modeling unit 12 associated with the decoding unit 14. Thus, the decoder must receive the cumulative occurrence count Q(m), Q(i), and $n_i$. In addition, the decoder must have the most significant portion ($w_1$+w MSB's) of the code string C(s). The structure of the decoder will include a C register and an A register corresponding to the identically-denoted registers in the encoder, with the same interpretation of their contents as binary fractional numbers. As with the encoder 14, the decoder has provision for normalizing the received occurrence counts.

The decoding is initiated by filling the C register with the w first symbols of the code string to be decoded and by setting the contents of the A register to 1.0 ... 0. Then, $\overline{Q}(m)$ is read for the next symbol and tested against the contents of the A register. If $\overline{Q}(m)$ is less than the magnitude of the A register contents, ($\beta$) is set equal to 0, otherwise ($\beta$) is set equal to 1. Then, the largest symbol j such that $2^{-(\beta)}\overline{Q}(j) \leq C$ is found. The symbol is decoded as the so-found largest symbol, say, i. If the decoded symbol i is not m, the value $2^{-(\beta)}\overline{Q}(i)$ is subtracted from C and $2^{(\beta)}\overline{n}_i$ is inserted into A. Otherwise, the quantity $2^{-(\beta)}\overline{Q}(m)$ is subtracted from both C and A. Once C and A are updated, their contents are simultaneously left-shifted as many positions as needed to bring the contents of A to the range (4), after which the remaining positions in C are filled with the next most significant symbols from the code string. If the end-of-string symbol is encountered, the process stops. Otherwise, the process is repeated.

Table IV illustrates decoding of the code string C(s) obtained by operation of the Table II coding example. For convenience, the code string generated by that example is C(s)=00000100110100*.

TABLE IV

| Decoded Symbol | ($\overline{Q}(2), \overline{Q}(3), \overline{n}_i$) | | C REG | A REG |
| --- | --- | --- | --- | --- |
| Initialize | | | 000.0010 | 1.000 |
| 1 | (0.01,0.10,0.01) | | 000.0010 | 0.010 |
| | | shift | 000.1001 | 1.000 |
| 2 | (0.10,0.11,0.01) | | 000.0001 | 0.010 |
| | | shift | 000.0110 | 1.000 |
| 2 | (0.10,1.00,0.10) | scale by ½ | | |
| | (0.01,0.1,0.01) | | 000.0010 | 0.010 |
| | | shift | 000.1010 | 1.000 |
| 3 | (0.01,0.101,0.001) | | 000.0000 | 0.011 |
| | | shift | 000.0000 | 0.110 |
| 1 | (0.01,0.101,0.01) | | 000.0000 | 0.010 |
| | | shift | 000.00* | 1.000 |
| 1 | (0.011,0.110,0.011) | | 000.00* | 0.011 |
| | | | 000.0* | 0.110 |

As with the modeling unit 12 associated with the encoder, the decoder modeling unit will assume at the beginning that the probabilities of occurrence of the symbols 1, 2, and 3 are equally likely, which means that it will initially assign each of them an individual count of 1. These occurrence counts are updated as symbols are decoded in the compressed string. Further, as stated above, the decoder C and A registers are initialized with the first w bits of the code stream and 1.000, respectively.

In the first iteration of the decoding method, the value in the C register is less than the normalized cumulative count $\overline{Q}(2)$, so the value of the normalized cumulative count $\overline{Q}(1)$, which is 0, is subtracted from the C register contents, while the normalized initial count $\overline{n}_1$ is inserted into A. A 1 is decoded and the contents of C and A are shifted as many positions as is required to bring A into the range (4) and the decoding process is repeated.

It is noted that the decoding of the second 2 is preceded by scaling the cumulative counts by $\frac{1}{2}$, since the normalized cumulative count $\overline{Q}(3)$ is not less than the contents of A. Further, the subtraction of $\overline{Q}(3)$ from both C and A follows the decoding of the symbol 3.

It will be evident to the skilled artisan that the embodiment of the decoder corresponds essentially to that of the encoder. It includes a modeling unit to which successive decoded symbols are applied to obtain the normalized occurrence counts. However, in contrast to the encoder, the decoder requires the ability to subtract the normalized cumulative count from the contents of C. Further, the decoder requires interpretative logic to determine the largest symbol j as prescribed above.

Figure 4:
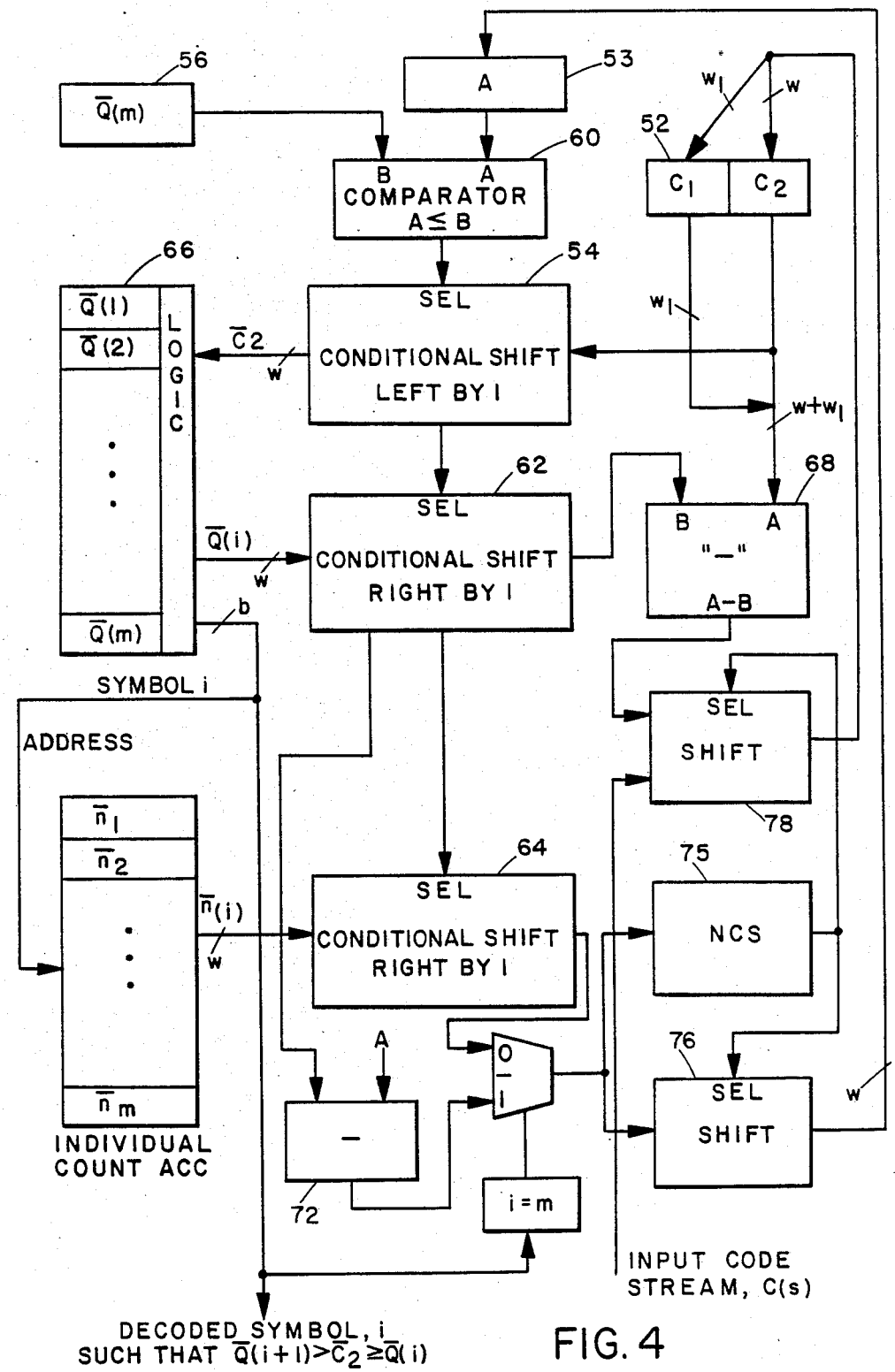
FIG. 4 is a block diagram of a decoding apparatus that decodes a compressed arithmetically-encoded stream produced by the encoder of FIG. 3.

Referring now to FIG. 4, the decoder block diagram performs the above-described decoding method by employing shift operations for the relative scaling of parameters when the magnitude of $\overline{Q}(m)$ equals or exceeds the magnitude of a(s), interpreting the $w_1+w$ most significant bits of the code stream, decrementing the code stream following interpretation, and concurrently updating the variable and aligning the code stream.

The decoding unit operates in response to the unnormalized occurrence counts provided by its associated modeling unit; in this case, the normalization of the counts is performed as described above for the encoder, but is not illustrated in FIG. 4. Initially, the first w bits of the code string C(s) are placed in the $C_2$ portion of the C register 52 and provided therethrough to a conditional left-shift circuit 54. The A register 55 is conventionally initialized to a count of 1.0 . . . 0. The initial value of $\overline{Q}(m)$ is provided from the storage device 56 to binary comparator 60. The comparator 60 compares the magnitudes of $\overline{Q}(m)$ and the contents of the A register and, according to the outcome of the comparison, provides one of two states of a SHIFT SELECT signal to the conditional left-shift circuit 54 and to the conditional right-shift circuits 62 and 64. If the magnitude of the A register contents is the greater, the shift circuits 54, 62, and 64 will pass the binary values at their respective inputs to their respect outputs without shifting them. For the other state of the SHIFT SELECT signal, the conditional shift circuits will shift their respective binary input signals by one bit in the direction indicated. Thus, if the magnitude of $\overline{Q}(m)$ exceeds the magnitude of the A register contents, the w most significant bits of C(s) will be shifted left by one bit, corresponding to scaling the value represented by the bits by 2. The same condition of the SHIFT SELECT signal will cause $\overline{Q}(i)$ and $\overline{n}_i$ to the right-shifted (scaled by $\frac{1}{2}$) by their respective associated shift circuits.

The shifted or unshifted w most significant bits of the code stream are provided to decode logic 66, which finds the largest symbol j such that $\overline{Q}(j)$ is less than or equal to C (or numeral 2C if the SHIFT SELECT signal causes a left-shift). It will be understood that the left-shift of the most significant end of the code stream is equivalent to scaling $\overline{Q}(j)$ by $\frac{1}{2}$ as is done in the above description of the decoding method.

Figure 5:
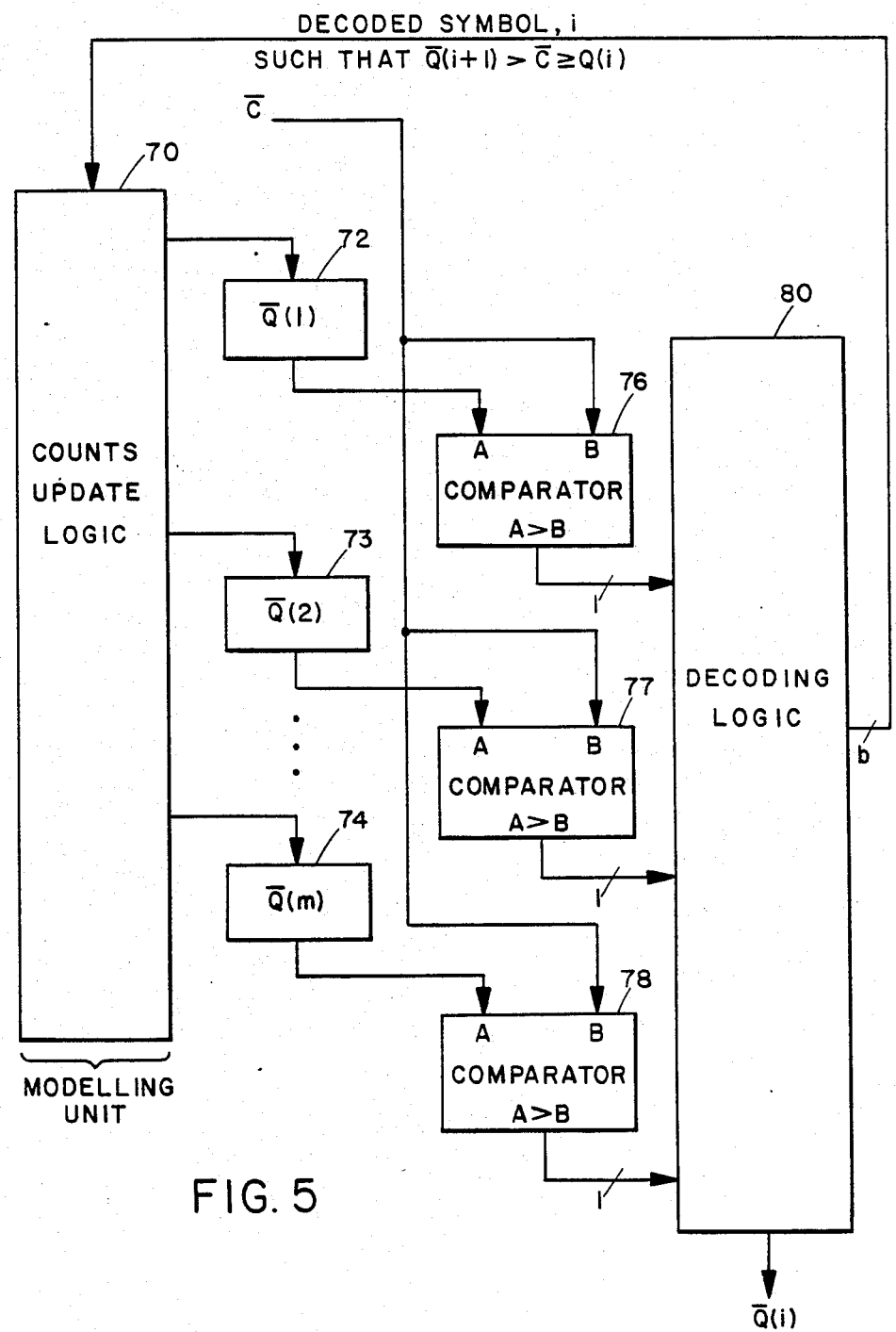
FIG. 5 is a block diagram showing in greater detail a cumulative count memory required for the operation of the FIG. 4 decoding unit.

The decoding logic can be better understood by reference to FIG. 5 where the updated occurrence counts are provided from modeling unit logic 70 to the decoder where they are normalized as described above and placed in storage devices 72-74. Each of the storage devices 72-74 holds a respective one of the cumulative occurrence counts $\overline{Q}(1)-\overline{Q}(m)$. Each of the normalized Q counts is fed to a binary comparator where it is compared against the output of the conditional left-shift circuit 54, that is the normalized most significant bits of the code stream. The decoding logic 80 detects $\overline{Q}(j)$ by determining at which point in the sequence of the comparators 76-78 output reversal takes place. When output reversal is detected, the decoding logic 80 will identify $\overline{Q}(j)$ as the input to the comparator immediately preceding the output bit reversal; conversion to the decoded symbol i is simply a matter of encoding the position of the output reversal.

Returning to FIG. 4, the decoding logic 66 provides the decoded symbol i and its associated cumulative count $\overline{Q}(i)$ as outputs. Decrementation of the most significant bits of the code stream occur in the subtracter 68, while the multiplexer 70 selects either the output of the conditional right-shift circuit 64 (that is, $\overline{n}_i$, shifted if indicated by the comparator 60) or the difference between the contents of the A register and the $\overline{Q}(m)$ available from the conditional right-shift 62 when the decoded symbol i is m; in this case the difference is given by the output of the subtracter 72.

The output selected by the multiplexer 70 is fed to the normalize control select (NCS) circuit 75 which operates in the same manner as the NCS circuits described above for the encoder 14 to determine, from the nonnormalized value of the selected output the left-shift distance required to bring a(s) into the range (4). The shift networks 76 and 78 appropriately shift the A and C register contents according to the decoding method described above.

It will be evident that the method and means described hereinabove for encoding and decoding in the case of an n-ary alphabet is applicable also to the case of a binary symbol string. In this case, x denotes the symbol to which the modeling unit 12 assigns the lower count; that is, $n_x \leq N/2$ digits. This low probability symbol (LPS), of course, depends on the portion of the string preceding the current symbol. The more probable symbol (MPS) is denoted by x'. Here k(n) is the number of binary digits in the total count N if it beings as 11; otherwise, k(n) is equal to the number of binary digits representing the total count N−1. As with the n-ary case, $\overline{N} = 2^{-k(n)}N$, which puts $\overline{N}$ into the range (4). Further, $\overline{n}_i = 2^{-k(n)}n_i$. With this, the coding operation in terms of the two registers described above, C and A, both having width w, is given by FIG. 6.

Figure 6:
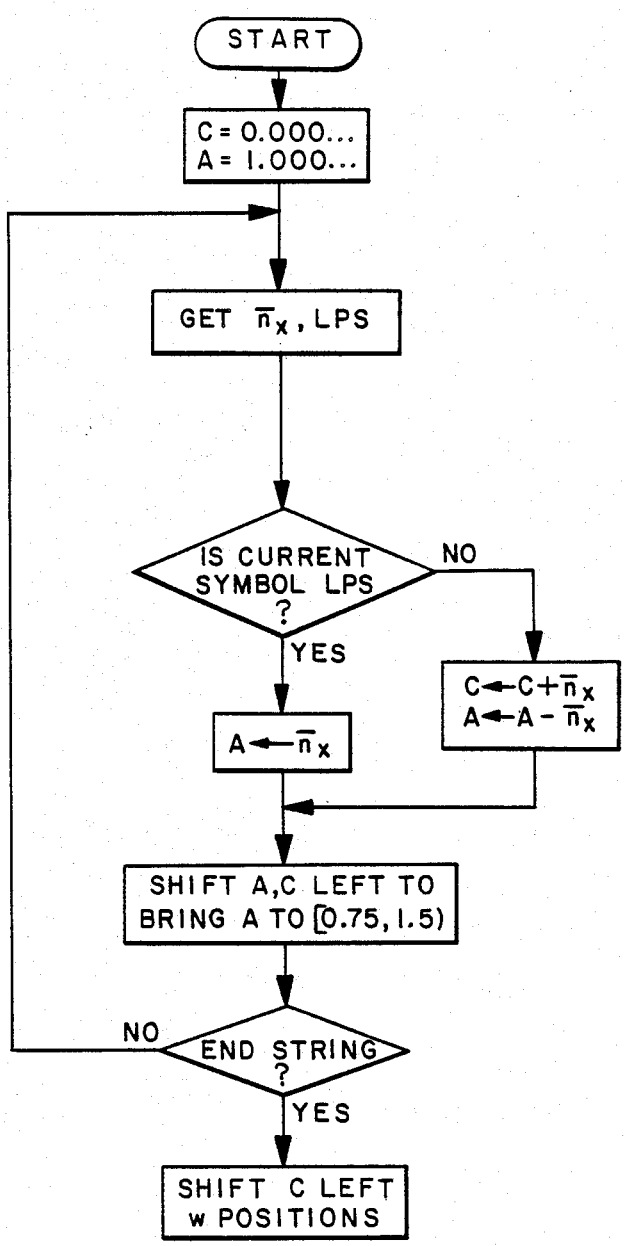
FIG. 6 is a flow diagram illustrating the adaptation of the FIG. 3 procedure to the special case where a binary symbol stream is to be encoded.

As in FIG. 6, register C is initially filled with zeros and A is set to 1.0 . . . 0. Then the next symbol causes the modeling unit to update the occurrence count. If the next symbol is the LPS, the contents of A are replaced by $\overline{n}_x$; if the next symbol is the MPS, the normalized occurrence count $\overline{n}_x$ is added to register C and subtracted from register A. In either case, once the contents of register A are changed, both the C and A registers are shifted left as many positions as required to bring the contents of A to the range (4). This procedure is followed for each symbol in a binary symbol stream. When the end of the binary symbol stream is detected, (for example, by detection of an end-of-string symbol), the contents of the C register are left-shifted w positions. Again, the symbols that are successively left-shifted out of the high-magnitude end of the C register constitute the arithmetically-encoded symbol stream resulting from the compression of the unencoded binary stream.

The binary alphabet instantiation of the invention is implemented by stripping the FIG. 3 circuit of all of the hardware required for comparison of the normalized cumulative count for m with the contents of A and the associated right-shift and multiplexing circuitry. An additional multiplexer is required at the input to the shift circuit 44 that selects between the output of the adder 42 and the contents of the C register. The additional multiplexer and the multiplexer 34 provide for selection of operations based on whether the current symbol is an LPS. The inputs to the encoder in the binary case will be simply the normalized LPS occurrence count $\bar{n}_x$ and a binary signal indicating whether or not the current symbol is an LPS.

Decoding in the binary case is performed by virtually reversing the steps of encoding. Decoding also case requires the presence of the C and A registers, as well as a modeling unit to accumulate occurrence statistics and provide normalized occurrence counts to the decoder.

As with the n-ary decoding case, the C and A registers are initialized with the w most significant symbols of the code string and 1.0 ... 0, respectively. Next, the normalized LPS occurrence count is subtracted from the contents of the C register; if the difference is less than 0, the symbol is decoded as LPS and the A register is loaded with the normalized LPS count; otherwise, if the difference is greater than or equal to 0, the symbol is MPS, the C register is loaded with the difference, and the normalized LPS count, $\bar{n}_x$, is subtracted from the A register contents. Both registers are then shifted by as many positions as required to bring A to the range (4), while the same number of symbols are read from the code string into the vacated positions in the C register. If none exist, the process ceases.

Although the encoding and decoding cases discussed hereinabove are premised on the provision of elementary occurrence counts and the normalization of those counts to the range (4) by the encoder or decoder, it is to be understood that the normalization procedure can be apportioned to the modeling unit, in which case encoding and decoding would invole simply testing, combining, and shifting the C and A register contents. Further, encoding and decoding according to the invention can be adapted in a straightforward manner to respond to actual conditional probabilities, assuming the existence of a sophisticated modeling unit. Finally, the statistical counts used above are assumed to be provided from a non-stationary source. It is entirely within the scope of the invention to use stationary occurrence counts.

Obviously, many modifications and variations of the invention are possible in light of the above description. However, it will be understood by those skilled in the art that these alterations in the method and apparatus may be made without departing from the spirit or scope of the described invention.

We claim:

1. A method for recursive machine modification of a string C(s) of binary numbers to produce C(si) where C(si) is a compressed representation of and responsive to the next symbol i in a symbol string s, s being a concatenation of symbols drawn from an alphabet having at least two characters, 0, ... m, C(si) being a number in the semi-open coding range (0,1), the coding range being subdivided into intervals during successive machine string modification cycles, each interval being defined by its lower bound C(s) and a parameter A(s) such that (C(s), C(s)+A(s)), said method being executable upon a pair of registers C and A, each having a finite dimension, w, comprising the steps of:
   (a) placing respective initial contents in registers A and C;
   (b) for the next symbol i in the string s, reading in binary symbol occurrence statistics for the portion of s preceding i, said occurrence statistics including $n_i$, the count of occurrences of i, $Q(i) = n_0 + n_1 + \ldots + n_{i-1}$, the sum of counts for the symbols 0, 1, ... i−1 preceding i in said alphabet, $Q(m) = n_0 + n_1 + \ldots + n_{m-1}$, the sum of counts for the symbols preceding m in the alphabet, and N, the count of all symbols in the portion, normalizing N to a predetermined range, and normalizing $n_{(i)}$, Q(i), and Q(m) based upon the normalized value of N, and
   (1) if the next symbol i is not m, adding the normalized value of Q(i) to C, replacing the contents of A with the normalized value of $n_i$, and shifting C and A in a predetermined direction until the contents of A lie within a predetermined range, or
   (2) if the next symbol i is m, adding the normalized value of Q(m) to the contents of C, subtracting the normalized value of Q(m) from the contents of A, and shifting C and A in a predetermined direction until the contents of A lie within a predetermined range; and
   (c) if i is not the last symbol in s, then repeating step (b), or, if i is the last symbol in s, then shifting the contents of C in said predetermined direction by w positions.

2. The method of claim 1 further including, before the execution of steps (b)(1) or (b)(2), scaling the magnitudes of the normalized values of $n_{(i)}$, Q(i), and Q(m) by a predetermined amount unless Q(m) is less than the contents of A.

3. The method of claim 1 wherein said normalizing of the occurrence statistics N, $n_i$, Q(i) and Q(m) includes register-shifting of said binary occurrence statistics in a predetermined direction corresponding to a direction of increasing register content magnitude.

4. The method of claim 2 wherein said normalizing of said binary occurrence statistics includes register-shifting said binary occurrence statistics in a predetermined direction corresponding to a direction of increasing register content magnitude.

5. The method of claim 1 wherein the predetermined range is from $0.11_{binary}$ to $1.1_{binary}$, said initial C register contents are 0, and said initial A register contents are 1.00 ... 00.

6. A method for the cyclic machine modification of a binary number string C(s) to produce C(si), where C(si) is a compressed representation of and responsive to the next symbol b(i) from a binary symbol string s=b(1), b(2), ..., b(i), ... b(n), C(si) being a number in the semi-open coding range [0,1), the coding range being subdivided into intervals during successive machine string modification cycles, each interval being defined by its lower bound C(s) and a parameter A(s) such that (C(s), C(s)+A(s)), said method being executable upon a pair of registers A and C, each being of finite width w, comprising the steps of:

(a) placing respective initial contents in registers C and A;

(b) reading in, incrementally counting, and ascertaining whether the next symbol b(i) is a least probable symbol (LPS) or a most probable symbol (MPS), and (1) if b(i) is the last symbol in s, shifting the contents of C left by w positions, or (2) if b(i) is LPS, replacing the contents of A by the normalized count of LPS and shifting both A and C left until the contents of A lie within a predetermined range, or (3) if b(i) is MPS, adding to C and subtracting from A the normalized count of MPS and shifting both A and C left until the contents of A lie within a predetermined range; and (c) repeating step (b).

7. A method according to claim 6, wherein the predetermined range is from 0.75 to 1.50; and the C and A registers are respectively initialized to the value 0 and 1.00 ... 00.

8. An arithmetic encoder responsive to a symbol string s which is a concatenation of symbols drawn from an alphabet having two or more characters 0, ..., m, and to occurrence statistics $n_i$, $Q(i)$, $Q(m)$, and N which correspond respectively to the count of occurrences of the symbol i, the sum of the counts $n_0$ through $n_{i-1}$, the sum of the counts $n_0$ through $n_{m-1}$, and the count of all symbols in the portion of the string s preceding the symbol i for recursively modifying a code string C(s) to produce C(si), where C(si) is a compressed representation of the string si and si is the string s followed by the symbol i, comprising:

a first shift register containing the w-least-significant bits of C(si);

a second shift register containing an interval coding variable;

means responsive to N for normalizing $n_i$, $Q(i)$, and $Q(m)$ based upon the normalization of N to a predetermined range;

first arithmetic means for adding the normalized value of Q(i) to the contents of the first shift register if $i \neq m$ or for adding the normalized value of Q(m) to the contents of the first shift register if $i = m$;

second arithmetic means for placing the normalized value of $n_j$ into the second shift register if $i \neq m$ or for subtracting the normalized value of Q(m) from the contents of the second register if $i = m$; and shift means for concurrently shifting the contents of the first and second registers in a predetermined direction until the contents of the second register lie within said predetermined range.

9. The arithmetic encoder of claim 8 wherein said predetermined range is $(0.11_{binary}, 1.1_{binary})$.

10. The arithmetic encoder of claim 8 wherein said predetermined direction is a direction of increasing magnitude.

11. A decoder for deriving a symbol stream s, where s is a concatenation of symbols drawn from a multi-character slphabet 0, ..., m, in response to an arithmetically-encoded symbol stream C(s) and to occurrence statistics $n_i$, $Q(i)$, $Q(m)$, and N, which correspond respectively to the count of occurrences of the symbol i, the sum of the counts $n_0$ through $n_{i-1}$, the sum of the counts $n_0$ through $n_{m-1}$, and the count of all symbols in the portion of the string s preceding the symbol i for recursively modifying a code string C(s) to produce C(si), where C(si) is a compressed representation of the string si and si is the string s followed by the symbol i, comprising:

a first shift register containing the w-most-significant bits of C(s);

a second shift register containing an interval decoding variable;

means responsive to N for normalizing $n_i$, $Q(i)$, and $Q(m)$ based upon the normalization of N to a predetermined range;

means for determining a symbol j in said alphabet such that the normalized value of $Q(j) \leq$ the contents of the first shift register;

first arithmetic means for subtracting the normalized value of Q(j) from the contents of the first register;

second arithmetic means for placing the normalized value of $n_j$ into the second register if $j \neq m$ or for subtracting the normalized value of Q(m) from the contents of the second register if $j = m$; and shift means for simultaneously shifting the contents of the first and second registers in a predetermined magnitude direction until the contents of the second register lie within said predetermined range and for shifting the next-most-significant portion of C(s) into the portion of the first register vacated by said simultaneous shifting.

12. The decoder of claim 11 wherein said predetermined range is $[0.11_{binary}, 1.1_{binary})$.

* * * * *